(12) United States Patent
Zhang et al.

(10) Patent No.: US 12,727,314 B2
(45) Date of Patent: Sep. 1, 2026

(54) LAMP PLATE AND DISPLAY PANEL

(71) Applicant: Wuhan China Star Optoelectronics Technology Co., Ltd., Wuhan (CN)

(72) Inventors: Ze Zhang, Wuhan (CN); Lei Zhu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 18/557,054

(22) PCT Filed: Jun. 29, 2023

(86) PCT No.: PCT/CN2023/104258
§ 371 (c)(1),
(2) Date: Oct. 25, 2023

(87) PCT Pub. No.: WO2024/239422
PCT Pub. Date: Nov. 28, 2024

(65) Prior Publication Data

US 2026/0068398 A1 Mar. 5, 2026

(30) Foreign Application Priority Data

May 22, 2023 (CN) ......................... 202310573470.6

(51) Int. Cl.
*H10H 29/853* (2025.01)
*G02F 1/13357* (2006.01)

(52) U.S. Cl.
CPC ..... *H10H 29/853* (2025.01); *G02F 1/133603* (2013.01); *G02F 1/133609* (2013.01); *G02F 1/133611* (2013.01)

(58) Field of Classification Search
CPC ......... G02F 1/133606; G02F 1/133607; G02F 1/133611
See application file for complete search history.

(56) References Cited

U.S. PATENT DOCUMENTS

2018/0331152 A1 11/2018 Lee

FOREIGN PATENT DOCUMENTS

CN 101435947 A * 5/2009
CN 101684904 A * 3/2010 ........... G02B 6/0068
CN 201449505 U 5/2010
CN 201621563 U 11/2010
CN 211087261 U 7/2020
(Continued)

OTHER PUBLICATIONS

International Search Report in International application No. PCT/CN2023/104258, mailed on Jan. 26, 2024.
(Continued)

*Primary Examiner* — Matthew J. Peerce
(74) *Attorney, Agent, or Firm* — Nathan & Associates Patent Agents Ltd.; Menachem Nathan

(57) ABSTRACT

A lamp plate and a display panel, a luminance combination region in the lamp plate includes a first luminance partition and multiple second luminance partitions surrounding and sharing edges with the first luminance partition, a center of the first luminance partition is defined as a first center, and the centers of the second luminance partitions are defined as second centers, and in one luminance combination region, distances between each one of the second centers and the first center are equal.

20 Claims, 3 Drawing Sheets

(56) References Cited

FOREIGN PATENT DOCUMENTS

| | | | | | |
|---|---|---|---|---|---|
| CN | 114566128 A | * | 5/2022 | ........... G09G 3/3426 |
| CN | 114783383 A | * | 7/2022 | ............... G09G 3/36 |
| CN | 114913783 A | | 8/2022 | |
| CN | 116047812 A | | 5/2023 | |
| CN | 116312279 A | | 6/2023 | |

OTHER PUBLICATIONS

Written Opinion of the International Search Authority in International application No. PCT/CN2023/104258, mailed on Jan. 26, 2024.

Chinese Office Action issued in corresponding Chinese Patent Application No. 202310573470.6 dated Aug. 2, 2023, pp. 1-6.

Chinese Office Action issued in corresponding Chinese Patent Application No. 202310573470.6 dated Jun. 29, 2023, pp. 1-8.

* cited by examiner

LAMP PLATE AND DISPLAY PANEL

CROSS-REFERENCE TO RELATED APPLICATIONS

This application is a National Stage of International Application No. PCT/CN2023/104258, filed on Jun. 29, 2023, which claims priority to Chinese Patent Application No. 202310573470.6 filed on May 22, 2023. The disclosures of the aforementioned applications are incorporated herein by reference in their entireties.

TECHNICAL FIELD

The present application relates to display technologies, specifically, to a lamp plate and a display panel.

BACKGROUND

Mini/Micro-Light-emitting Diode (M-LED) technology refers to a technology of miniaturization and matrixing of LEDs. It involves integrating an array of high-density and small-sized LED chips on a substrate, reducing the pixel spacing from millimeter scale to micrometer or even nanometer scale.

Referring to FIG. 1, in a lamp plate of a related technology, A luminance unit array forms multiple rectangular light-emitting partitions 100'. These light-emitting partitions 100' are arranged sequentially in both row and column directions. The shape of the light-emitting partitions 100' is rectangular. Each light-emitting partition 100' includes a first light-emitting partition 101' and a second light-emitting partition 102'. M-LED chips are disposed at vertices of the light-emitting partitions 100'. Due to the stronger light emission directly from the above of the M-LED chips and the weaker light emission from the periphery of the chips, the luminance at the center of the light-emitting partitions 100' formed by multiple luminance units is lower, resulting in dark spots at the centers of the light-emitting partitions 100'. Additionally, a rectangular shape of the light-emitting partitions 100' causes the distance between the centers of two adjacent light-emitting partitions 100' sharing a common side in the row direction to be different from the distance between the centers of two adjacent light-emitting partitions 100' sharing a common side in the column direction. This leads to poor light mixing effect of the light-emitting partitions 100'. Furthermore, the sequential arrangement of the multiple light-emitting partitions 100' in both the row and column directions results in cross-shaped dark bands, such as the first dark band aa and the second dark band bb.

Consequently, due to the poor light mixing of the light-emitting partitions 100' and the presence of the cross-shaped dark bands, the lamp plate of the related technology suffers from poor luminance uniformity. This, in turn, results in poor display quality when applying the lamp plate to a display panel. This problem requires an urgent solution.

SUMMARY OF THE INVENTION

On the one hand, the present application provides a lamp plate, the lamp plate includes multiple luminance partitions, a shape of the luminance partitions is a regular polygon, and a light-emitting unit is arranged at each vertex of the luminance partitions, where the lamp plate includes at least one luminance combination region with a fixed shape, including a first luminance partition and a plurality of second luminance partitions surrounding and sharing edges with the first luminance partition, a center of the first luminance partition is defined as a first center, and the centers of the second luminance partitions are defined as second centers, where in one luminance combination region, distances between each one of the second centers and the first center are equal.

On the other hand, the present application provides a display panel, including any light panel as described above.

BRIEF DESCRIPTION OF THE DRAWINGS

To provide a clearer explanation of the technical solution in the present embodiment, a brief introduction to the accompanying drawings required for the description of the embodiment will be provided below. It is evident that the accompanying drawings described below are merely one or more embodiments of the present application. Those skilled in the art may obtain additional drawings based on these drawings without exercising inventive labor.

Figure 1:
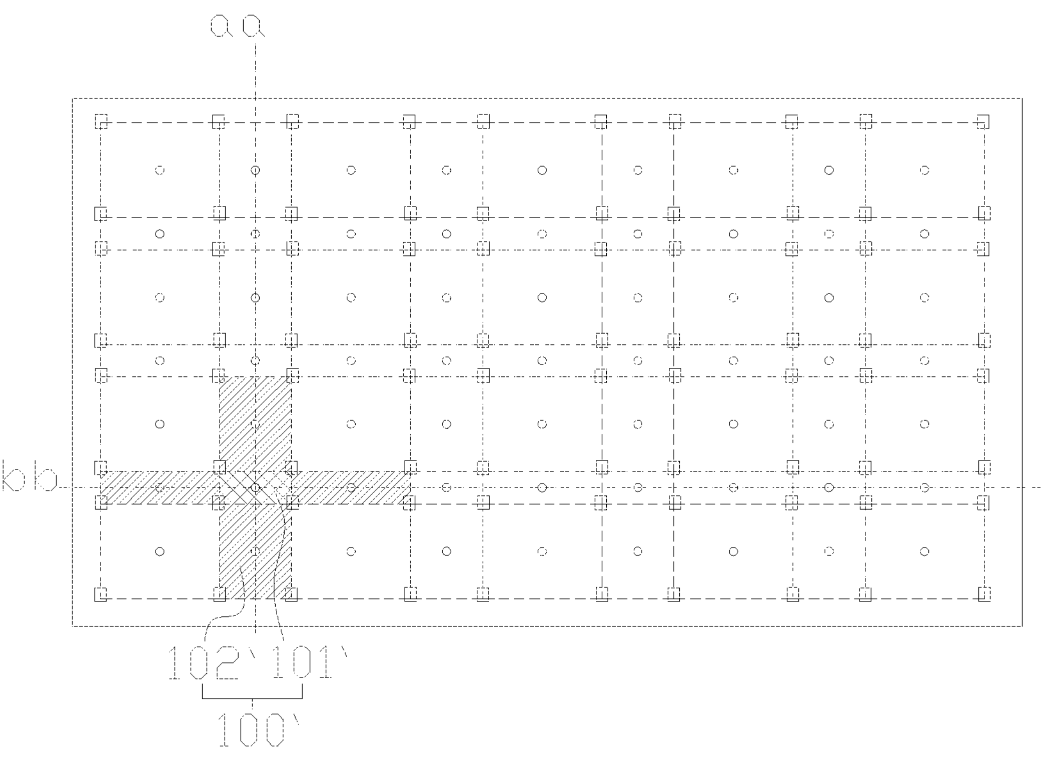
FIG. 1 is a schematic plan view of a lamp plate in a related technology.

LIST OF THE REFERENCE NUMBERS IN THE DRAWINGS lamp plate 01; luminance partition 10; luminance combination region 100; first luminance partition 101; second luminance partition 102; center 11; first center 111; second center 112; light-emitting unit 20; luminance auxiliary region 30; first side 31; second side 32; rectangular light-emitting region 40; first straight line AA; second straight line BB; third straight line CC; light-emitting partition 100'; first light-emitting partition 101'; second light-emitting partition 102'; first dark band aa; second dark band bb.

DETAILED DESCRIPTION

The technical solution in the present embodiment will be described clearly and comprehensively in conjunction with the accompanying drawings. It is evident that the described embodiment is only a part of the embodiments of the present application, not all of them. Based on the embodiments disclosed in the present application, all other embodiments obtained by those skilled in the art without exercising inventive labor fall within the scope of protection of the present application. Furthermore, it should be understood that the specific embodiments described herein are for the purpose of illustration and explanation of the present application and should not be construed as limiting the present application. In the present application, unless otherwise specified, positional terms such as “up” and “down” generally refer to the upper and lower positions in the actual use or working state of the device, specifically referring to the directions on the drawing; while “inner” and “outer” are relative to the outline of the device.

The following disclosure provides various embodiments or examples to implement different structures of the present application. In order to simplify the disclosure of the present application, specific components and configurations of certain examples are described in the following text. However, they are merely examples and are not intended to limit the present application. Furthermore, the present application may refer to the same numbers and/or reference letters in different examples for the purpose of simplification and clarity, and such repetition does not indicate any relationship between the various embodiments and/or configurations being discussed. Additionally, the present application provides examples of specific processes and materials, but those skilled in the art will appreciate the application of other processes and/or the use of other materials. The following descriptions are provided in detail, and it should be noted that the order of describing these embodiments does not imply any preference or limitation on the order of implementation.

Embodiment 1

Figure 2:
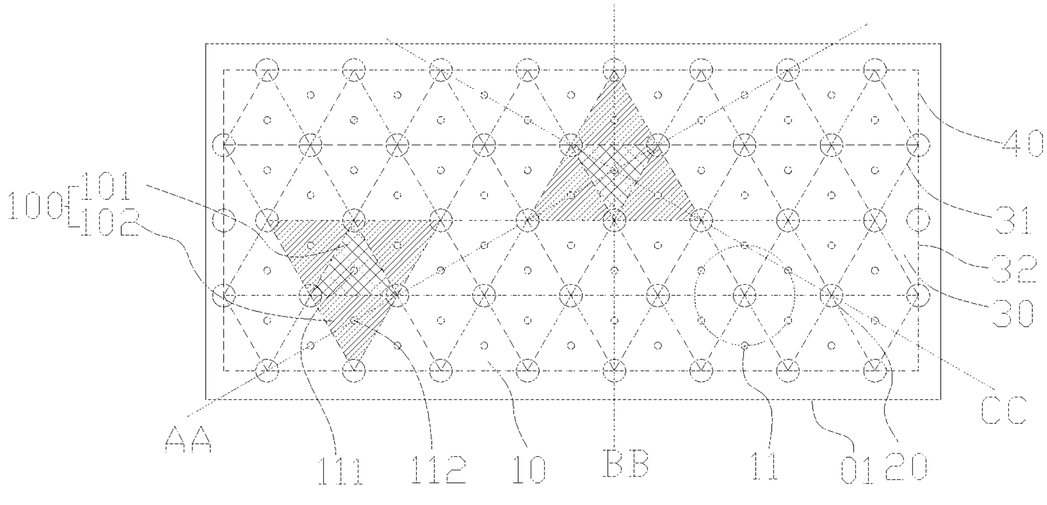
FIG. 2 is a schematic plan view of a lamp plate according to Embodiment 1 of the present application.

FIG. 2 is a schematic plan view of the lamp plate provided in Embodiment 1 of the present application. Referring to FIG. 2, Embodiment 1 provides a lamp plate 01, which includes multiple luminance partitions 10. Each luminance partition 10 has a shape of regular polygon, and on each vertex of the luminance partition 10 a light-emitting unit 20 is disposed. The lamp plate 01 includes at least one fixed-shaped luminance combination region 100, which includes a first luminance partition 101 and multiple second luminance partitions 102 surrounding and sharing edges with the first luminance partition 101. The center of the first luminance partition 101 is defined as a first center 111, and the centers of the second luminance partitions 102 are defined as second centers 112. In a luminance combination region 100, distances between each second center 112 and the first center 111 are equal.

In the provided lamp plate 01 of the present application, the distances between the second centers 112 of multiple second luminance partitions 102 surrounding and sharing edges with the first luminance partition 101 and the first center 111 of the first luminance partition 101 are equal within a luminance combination region 100. This arrangement enhances the light mixing effect of the luminance partitions 10, thereby improving the luminance uniformity of the lamp plate 01 and the display effect of the display panel.

In some embodiments of the present application, the lines connecting the second centers 112 with the first center 111 are located on three different straight lines.

In the related art, square light-emitting partitions, compared to rectangular light-emitting partitions, can improve the light mixing effect of the luminance partitions. However, they still suffer from the issue of dark bands. Specifically, the lines connecting the centers of the square light-emitting partitions surrounding and sharing edges with another square light-emitting partition to the center of the another square light-emitting partition are along two different lines. In contrast, in the provided lamp plate 01 of the present application, within a luminance combination region 100, all the lines connecting the second centers 112 to the first center 111 are located along three different lines. Therefore, it is possible to increase the number of possible arrangements between the dark spot in the first luminance partition 101 and the dark spots in the multiple second luminance partitions 102 that share edges with the first luminance partition 101. As a result, the dark bands are weakened or eliminated, thereby improving the brightness uniformity of the lamp plate 01 and the display effect of the display panel that utilizes the lamp plate 01. Specifically, the three different lines are referred to as a first line AA, a second line BB, and a third line CC.

Optionally, the luminance partitions 10 are in the shape of a regular triangle.

By disposing the shape of the luminance partitions 10 as a regular triangle and forming the luminance combination region 100 with a fixed number of regular triangles, the light mixing effect of the luminance partitions 10 within the luminance combination region 100 can be improved while increasing the number of the possible arrangements between the dark spot in the first luminance partition 101 and the dark spots in the multiple second luminance partitions 102 that share edges with the first luminance partition 101, thereby the dark bands are weakened or eliminated.

Specifically, the lamp plate 01 includes multiple luminance combination regions 100, each including four luminance partitions 10. Among the four luminance partitions 10, one is the first luminance partition 101, and the other three are the second luminance partitions 102. It should be noted that the multiple luminance combination regions 100 can share one or more luminance partitions 10.

In one or more embodiments of the present application, the center 11 of any one of the luminance partitions 10 in a luminance combination region 100 and the centers 11 of five other luminance partitions 10 are co-circular.

In the related arts, when multiple square luminance partitions are used to form a luminance combination structure, the center of any luminance partition can be co-circular with the centers of at most three other luminance partitions, resulting in a poor light mixing effect.

In the provided lamp plate 01 of the present application, in a luminance combination region 100, the center 11 of any luminance partition 10 can be co-circular with the centers 11 of five other luminance partitions 10. This significantly improves the light mixing effect of the luminance partitions 10 in the luminance combination region 100, enhancing the luminance uniformity of the lamp plate 01 and the display effect of the display panel applying the lamp plate 01. Specifically, the co-circular centers 11 of the six luminance partitions 10 are arranged around the same light-emitting unit 20.

In one or more embodiments of the present application, in a luminance combination region 100, minimum distances between the centers 11 of the plurality of luminance partitions 10 corresponding to one same light-emitting unit 20 and the edge of the light-emitting unit 20 are equal.

The minimum distances between the centers 11 of the luminance partitions 10 and the edge of the light-emitting unit 20 determine the extent to which the edge of the light-emitting unit 20 affects the luminance at the centers of the luminance partitions 10. The larger the minimum distance between the edge of the light-emitting unit 20 and the center 11 of a luminance partition 10, the lower the luminance at the center 11 of the luminance partition 10. The smaller the minimum distance between the edge of the light-emitting unit 20 and the center 11 of a luminance partition 10, the higher the luminance at the center 11 of the luminance partition 10. In the lamp plate 01 provided by the present application, the minimum distances between the centers 11 of the plurality of luminance partitions 10 corresponding to one same light-emitting unit 20 and the edge of the light-emitting unit 20 are equal. This ensures that the luminance at the centers 11 of the multiple luminance partitions 10 corresponding to the same light-emitting unit 20 tends to be consistent, thereby further improving the brightness consistency between the luminance partitions 10 in the luminance combination region 100. This leads to further enhancement of the brightness uniformity of the lamp plate 01 and the display effect of the display panel applying the lamp plate 01. Optionally, the shape of the light-emitting unit 20 is circular.

In some embodiments of the present application, in a luminance combination region 100, the overlapping areas of multiple luminance partitions 10 corresponding to one same light-emitting units 20 and the light-emitting units 20 are equal.

Specifically, in the multiple luminance partitions 10 corresponding to the same light-emitting unit 20, the overlapping area of each luminance partition 10 and the light-emitting unit 20 determines the degree of influence of the light-emitting unit 20 on the luminance partition 10. The larger the overlapping area of the luminance partition 10 and the light-emitting unit 20, the greater the influence of the light-emitting unit 20 on the luminance of the luminance partition 10. Conversely, the smaller the overlapping area of the luminance partition 10 and the light-emitting unit 20, the lesser the influence of the light-emitting unit 20 on the luminance of the luminance partition 10. In the provided lamp plate 01, due to the fact that the overlapping areas of the multiple luminance partitions 10 corresponding to the same light-emitting units 20 and the light-emitting units 20 are equal, it is possible to make the influence of the same light-emitting unit 20 on these luminance partitions 10 to be consistent. This further improves the luminance consistency between the luminance partitions 10 in the luminance combination region 100, enhancing the luminance uniformity of the lamp plate 01 and the display effect of the display panel applying the lamp plate 01.

In some embodiments of the present application, the lamp plate 01 further includes multiple luminance auxiliary regions 30 disposed at the edges of the lamp plate 01. The multiple luminance auxiliary regions 30 and the multiple luminance partitions 10 form a rectangular light-emitting region 40. The shapes of the luminance auxiliary regions 30 are different from the shape of the luminance partitions 10. On at least one vertex of each of the luminance auxiliary regions 30, a light-emitting unit 20 is disposed, and the luminance auxiliary region 30 shares an edge with at least one luminance partition 10.

To perfectly match the display panel, specifically, the lamp plate 01 needs to correspond to the display region of the display panel. Currently, the display region of the display panel is generally rectangular. However, when the lamp plate 01 only includes the luminance combination regions 100 each comprising of triangular luminance partitions 10, the light-emitting region of the lamp plate 01 is not rectangular. Therefore, to improve the compatibility between the lamp plate 01 and the display panel, the lamp plate 01 includes multiple luminance auxiliary regions 30 disposed at the edges of the lamp plate 01. The multiple luminance auxiliary regions 30 and the multiple luminance partitions 10 form a rectangular light-emitting region 40. Additionally, to enhance design flexibility, the shapes of the luminance auxiliary regions 30 are different from the shape of the luminance partitions 10. Due to the potential differences in the brightness between the luminance auxiliary regions 30 and the luminance partitions 10, it is desirable to minimize the number of the luminance auxiliary regions 30 in order to weaken the differences. When each luminance auxiliary region 30 shares an edge with at least one luminance partition 10, the light-emitting units 20 can be shared between the luminance auxiliary regions 30 and the edge-shared luminance partitions 10, minimizing the number of luminance auxiliary regions 30.

In some embodiments of the present application, at least one luminance auxiliary region 30 includes a first side 31 and a second side 32 sharing an edge with the luminance partition 10, where the length of the first side 31 is greater than the length of each second side 32. On at least one first side 31 of the luminance auxiliary regions 30 a light-emitting unit 20 is disposed.

Specifically, a luminance auxiliary region 30 includes a side sharing an edge with a luminance partition 10 as well as a side sharing no edge. Since the luminance auxiliary regions 30 are designed to form a rectangular shape together with the irregularly shaped luminance combination regions 100, the length of the side sharing no edge, which is the first side 31, may be much greater than the lengths of the sides sharing an edge with a luminance partition 10 in at least one luminance auxiliary region 30. This structure may result in lower luminance at the first side 31. By disposing a light-emitting unit 20 on at least one first side 31 of the luminance auxiliary regions 30, the luminance at the first side 31 can be effectively improved, thereby enhancing the luminance uniformity at the edge of the lamp plate 01.

In some embodiments of the present application, the light-emitting units 20 are each an effective light-emitting portion of an LED chip. The size of the LED chip is not limited in the present application. Preferably, the LED chip is an M-LED chip with a size below 200 micrometers.

Furthermore, the present application provides a display panel including a display panel body and any aforementioned lamp plate 01. The lamp plate 01 has a light emitting side, and the display panel body is disposed on the light emitting side of the lamp plate 01.

Optionally, the display panel is a liquid crystal display panel, and the display panel body includes a liquid crystal cell including an array substrate, a color filter substrate, and a liquid crystal layer positioned between the array substrate and the color filter substrate.

Embodiment 2

Figure 3:
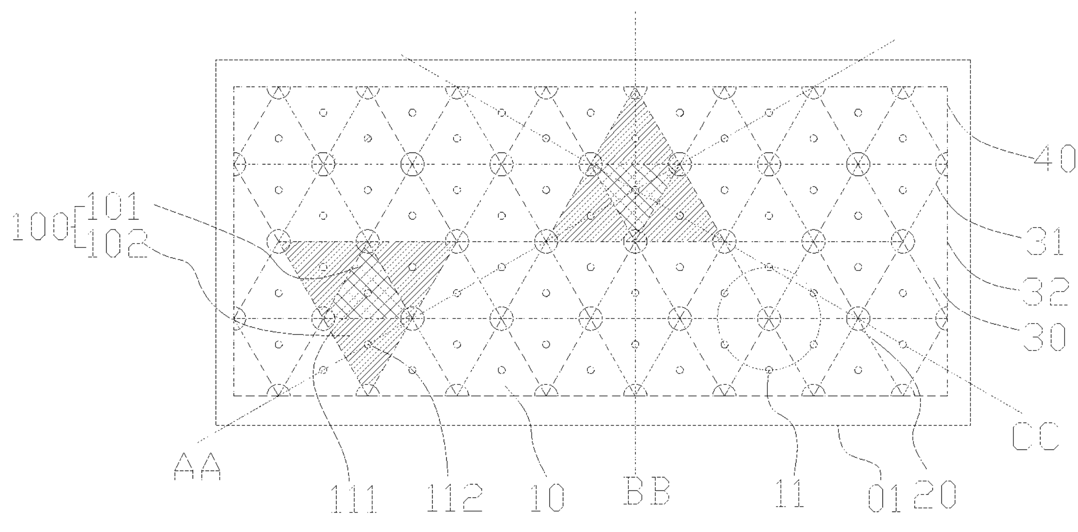
FIG. 3 is a schematic plan view of a lamp plate according to Embodiment 2 of the present application.

FIG. 3 is a schematic plan view of the lamp plate provided in Embodiment 2 of the present application. Referring to FIG. 3, Embodiment 2 provides a lamp plate 01 and a display panel. The lamp plate 01 includes multiple luminance partitions 10. Each luminance partition 10 has a shape of regular polygon, and on each vertex of the luminance partition 10 a light-emitting unit 20 is disposed. The lamp plate 01 includes at least one fixed-shaped luminance combination region 100, which includes a first luminance partition 101 and multiple second luminance partitions 102 surrounding and sharing edges with the first luminance partition 101. The center of the first luminance partition 101 is defined as a first center 111, and the centers of the second luminance partitions 102 are defined as second centers 112. In a luminance combination region 100, the distances between each second center 112 and the first center 111 are equal. The display panel includes a display panel body and any aforementioned lamp plate 01. The lamp plate 01 has a light emitting side, and the display panel body is disposed on the light emitting side of the lamp plate 01.

The structure of the lamp plate 01 and the display panel provided in Embodiment 2 of the present application is similar to that in Embodiment 1, and the same parts are not described again in Embodiment 2.

The difference is that each light-emitting unit 20 is disposed within the rectangular light-emitting region 40, which further improves the luminance uniformity at the edges of the lamp plate 01. Specifically, the shape of the light-emitting units 20 at the edges of the rectangular light-emitting region 40 is different from the other light-emitting units 20. In the actual production process, the light-emitting units 20 to be disposed at the edges of the rectangular light-emitting region 40 can be formed by pre-cutting.

In some embodiments of the present application, at least one luminance auxiliary region 30 includes a first side 31 and a second side 32 sharing an edge with a luminance partition 10, and the length of the first side 31 is greater than the length of each second sides 32. In this case, no light-emitting unit 20 is disposed on the first side 31 of the at least one luminance auxiliary region 30. Since no light-emitting unit 20 is disposed on the first side 31 of the at least one luminance auxiliary region 30, the number of light-emitting units 20 can be reduced, thereby reducing the number of the light-emitting units 20 that need to be pre-cut in advance and reducing the manufacturing cost.

Embodiment 3

Figure 4:
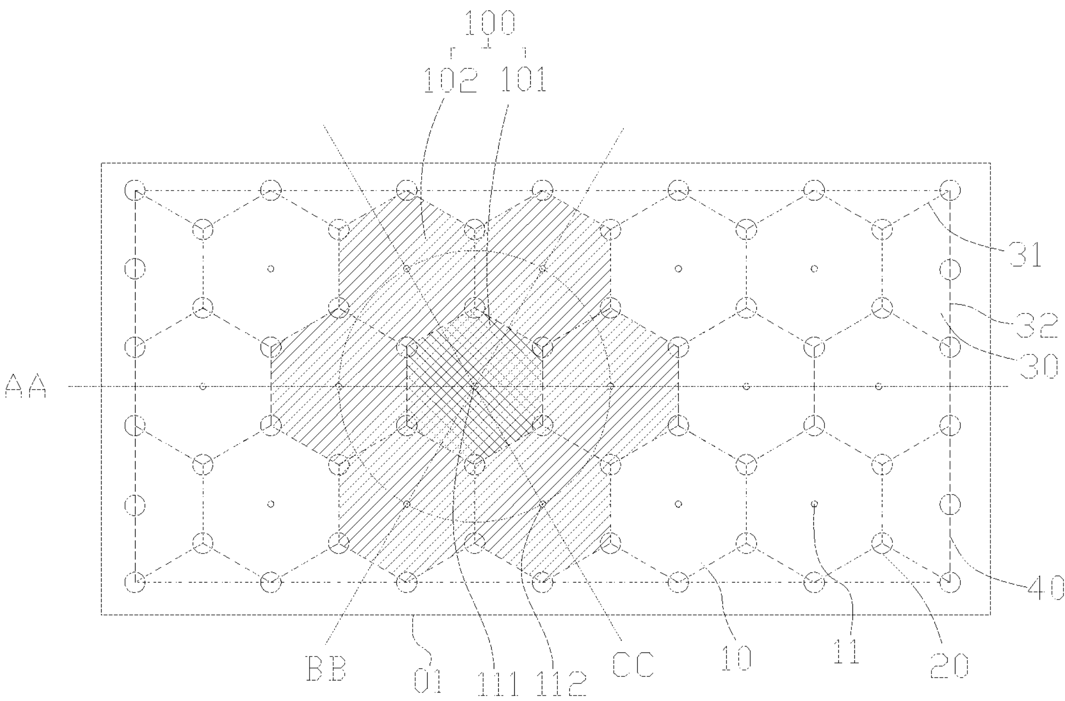
FIG. 4 is a schematic plan view of a lamp plate according to Embodiment 3 of the present application.

FIG. 4 is a schematic plan view of the lamp plate provided in Embodiment 3 of the present application. Referring to FIG. 4, Embodiment 3 provides a lamp plate 01 and a display panel. The lamp plate 01 includes multiple luminance partitions 10. Each luminance partition 10 has a shape of regular polygon, and on each vertex of the luminance partition 10 is disposed with a light-emitting unit 20. The lamp plate 01 includes at least one fixed-shaped luminance combination region 100, which includes a first luminance partition 101 and multiple second luminance partitions 102 surrounding and sharing edges with the first luminance partition 101. The center of the first luminance partition 101 is defined as a first center 111, and the centers of the second luminance partitions 102 are defined as second centers 112. In a luminance combination region 100, the distances between each second center 112 and the first center 111 are equal. The display panel includes a display panel body and any aforementioned lamp plate 01. The lamp plate 01 has a light emitting side, and the display panel body is disposed on the light emitting side of the lamp plate 01.

The structure of the lamp plate 01 and the display panel provided in Embodiment 3 of the present application is similar to that in Embodiment 1, and the same parts are not described again in Embodiment 3.

The difference is that the shape of the luminance partitions 10 is a regular hexagon. When the shape of the luminance partitions 10 is a regular hexagon, each luminance combination region 100 includes seven luminance partitions 10. Among the seven luminance partitions 10, one is the first luminance partition 101, and the other six are the second luminance partitions 102. It should be noted that multiple luminance combination regions 100 can share one or more luminance partitions 10.

Furthermore, in a luminance combination region 100, the center 11 of any luminance partition 10 may be co-circular with the centers 11 of five other luminance partitions 10. This significantly improves the light mixing effect of the luminance partitions 10 in the luminance combination region 100, enhancing the luminance uniformity of the lamp plate 01 and the display effect of the display panel applying the lamp plate 01. Specifically, the co-circular centers 11 of the six luminance partitions 10 are arranged around one same light-emitting unit 20.

Embodiment 4

Figure 5:
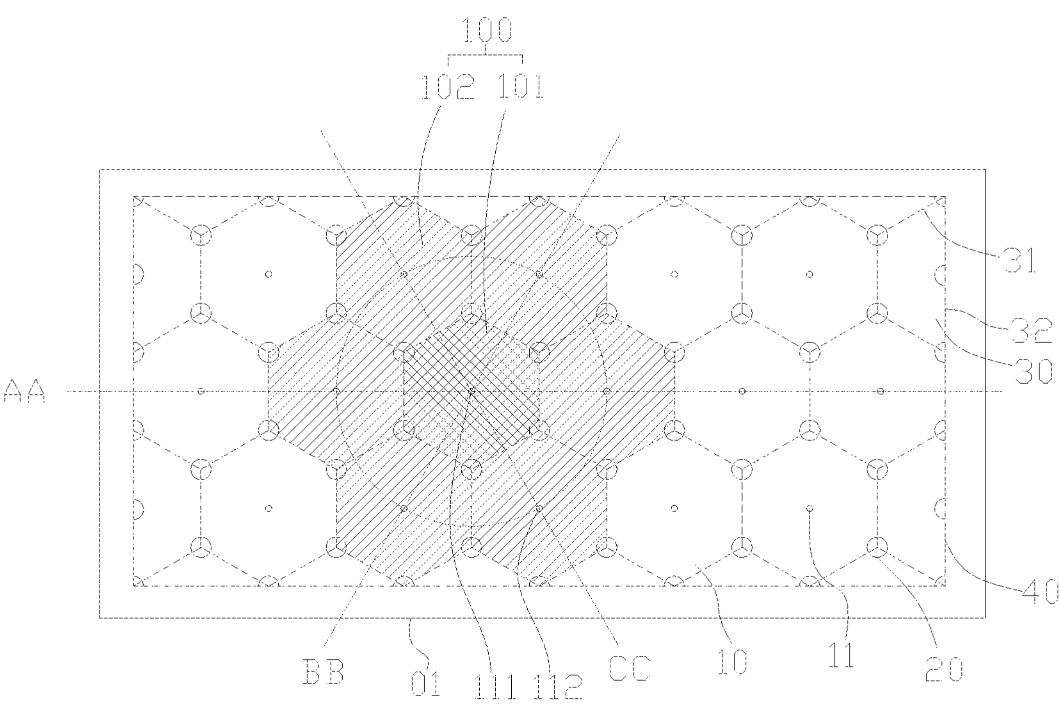
FIG. 5 is a schematic plan view of a lamp plate according to Embodiment 4 of the present application.

FIG. 5 is a schematic plan view of the lamp plate provided in Embodiment 4 of the present application. Referring to FIG. 5, Embodiment 4 provides a lamp plate 01 and a display panel. The lamp plate 01 includes multiple luminance partitions 10. Each luminance partition 10 has a shape of regular polygon, and on each vertex of the luminance partition 10 a light-emitting unit 20 is disposed. The lamp plate 01 includes at least one fixed-shaped luminance combination region 100, which includes a first luminance partition 101 and multiple second luminance partitions 102 surrounding and sharing edges with the first luminance partition 101. The center of the first luminance partition 101 is defined as a first center 111, and the centers of the second luminance partitions 102 are defined as second centers 112. In a luminance combination region 100, the distances between each second center 112 and the first center 111 are equal. The display panel includes a display panel body and any aforementioned lamp plate 01. The lamp plate 01 has a light emitting side, and the display panel body is disposed on the light emitting side of the lamp plate 01.

The structure of the lamp plate 01 and the display panel provided in Embodiment 4 of the present application is similar to that in Embodiment 3, and the same parts are not described again in Embodiment 4.

The difference is that each light-emitting unit 20 is disposed within the rectangular light-emitting region 40, which further improves the luminance uniformity at the edges of the lamp plate 01. Specifically, the shape of the light-emitting units 20 at the edges of the rectangular light-emitting region 40 is different from the other light-emitting units 20. In the actual production process, the light-emitting units 20 to be disposed at the edges of the rectangular light-emitting region 40 can be formed by pre-cutting.

In summary, the present application provides a lamp plate and a display panel. The lamp plate includes multiple luminance partitions. Each luminance partition has a shape of regular polygon, and on each vertex of the luminance partition a light-emitting unit is disposed. The lamp plate includes at least one fixed-shaped luminance combination region, which includes a first luminance partition and multiple second luminance partitions surrounding and sharing edges with the first luminance partition. The center of the first luminance partition is defined as a first center, and the centers of the second luminance partitions are defined as second centers. In a luminance combination region, the distances between each second center and the first center are equal. The lamp plate and the display panel provided by the present application can improve the light mixing effect of the luminance partitions, weaken or eliminate dark bands, and enhance the luminance uniformity of the lamp plate and the display effect of the display panel.

The lamp plate and the display panel provided in some embodiments of the present application have been described in detail above. The description of the above embodiments merely aims to help to understand the present application. Many modifications or equivalent substitutions with respect to the embodiments may occur to those of ordinary skill in the art based on the present application. Thus, these modifications or equivalent substitutions shall fall within the scope of the present application.

What is claimed is:

1. A lamp plate, wherein the lamp plate comprises a plurality of luminance partitions, a shape of each of the plurality of luminance partitions is a regular polygon, and a light-emitting unit is arranged at each vertex of the plurality of luminance partitions, wherein the lamp plate comprises at least one luminance combination region with a fixed shape, comprising a first luminance partition among the plurality of luminance partitions and a plurality of second luminance partitions among the plurality of luminance partitions surrounding and sharing edges with the first luminance partition, a center of the first luminance partition is defined as a first center, and centers of the second luminance partitions are defined as second centers, wherein in one said luminance combination region, distances between each one of the second centers and the first center are equal;

wherein a shape of each of the light-emitting units is circular; and wherein the lamp plate further comprises a plurality of luminance auxiliary regions disposed at an edge of the lamp plate, the plurality of luminance auxiliary regions and the plurality of luminance partitions form a rectangular light-emitting region, at least one of the luminance auxiliary regions comprises a first side and a second side, the second side shares an edge with one of the luminance partitions, and at least one of the light-emitting units is arranged on the first side of at least one of the plurality of luminance auxiliary regions; and wherein a spacing is formed between the rectangular light-emitting region and edges of the lamp plate, and the first side overlaps with one of the edges of the lamp plate.

2. The lamp plate according to claim 1, wherein lines connecting all the second centers to the first center are located on three different straight lines.

3. The lamp plate according to claim 2, wherein the center of any one of the luminance partitions is co-circular with the centers of other five of the luminance partitions.

4. The lamp plate according to claim 2, wherein minimum distances between the centers of the luminance partitions corresponding to a same one of the light-emitting units and an edge of the same one of the light-emitting units are equal.

5. The lamp plate according to claim 4, wherein overlapping areas of the luminance partitions corresponding to a first light-emitting unit and the first light-emitting unit are equal.

6. The lamp plate according to claim 2, wherein a shape of the luminance auxiliary regions is different from the shape of the luminance partitions, a light-emitting unit is arranged on at least one vertex of the luminance auxiliary regions, and the luminance auxiliary regions share an edge with at least one of the luminance partitions.

7. The lamp plate according to claim 6, wherein all the light-emitting units are arranged within the rectangular light-emitting region.

8. The lamp plate according to claim 6, wherein a length of the first side is greater than a length of the second side.

9. The lamp plate according to claim 8, wherein all the light-emitting units are disposed within the rectangular light-emitting region.

10. The lamp plate according to claim 2, wherein the shape of the luminance partitions is either a regular triangle or a regular hexagon, wherein, under a condition the shape of the luminance partitions is a regular triangle, the luminance combination region comprises one said first luminance partition and three said second luminance partitions, under the condition the shape of the luminance partitions is a regular hexagon, the luminance combination region includes one said first luminance partition and six second said luminance partitions.

11. A display panel comprising a lamp plate, wherein the lamp plate comprises a plurality of luminance partitions, a shape of each of the plurality of luminance partitions is a regular polygon, and a light-emitting unit is arranged at each vertex of the plurality of luminance partitions, wherein the lamp plate comprises at least one luminance combination region with a fixed shape, comprising a first luminance partition among the plurality of luminance partitions and a plurality of second luminance partitions among the plurality of luminance partitions surrounding and sharing edges with the first luminance partition, a center of the first luminance partition is defined as a first center, and centers of the second luminance partitions are defined as second centers, wherein in one said luminance combination region, distance between each one of the second centers and the first center are equal;

wherein a shape of each of the light-emitting units is circular; and wherein the lamp plate further comprises a plurality of luminance auxiliary regions disposed at an edge of the lamp plate, the plurality of luminance auxiliary regions and the plurality of luminance partitions form a rectangular light-emitting region, at least one of the luminance auxiliary regions comprises a first side and a second side, the second side shares an edge with one of the luminance partitions, and at least one of the light-emitting units is arranged on the first side of at least one of the plurality of luminance auxiliary regions; and wherein a spacing is formed between the rectangular light-emitting region and edges of the lamp plate, and the first side overlaps with one of the edges of the lamp plate.

12. The display panel according to claim 11, wherein lines connecting all the second centers to the first center are located on three different straight lines.

13. The display panel according to claim 12, wherein the center of any one of the luminance partitions is co-circular with the centers of the other five of the luminance partitions.

14. The display panel according to claim 12, wherein minimum distances between the centers of the luminance partitions corresponding to a same one of the light-emitting units and an edge of the same one of the light-emitting units are equal.

15. The display panel according to claim 14, wherein overlapping areas of the luminance partitions corresponding to a first light-emitting unit and the first light-emitting unit are equal.

16. The display panel according to claim 12, wherein a shape of the luminance auxiliary regions is different from the shape of the luminance partitions, a light-emitting unit is arranged on at least one vertex of the luminance auxiliary regions, and the luminance auxiliary regions share an edge with at least one of the luminance partitions.

17. The display panel according to claim 16, wherein all the light-emitting units are arranged within the rectangular light-emitting region.

18. The display panel according to claim 16, wherein a length of the first side is greater than a length of the second side.

19. The display panel according to claim 18, wherein all the light-emitting units are arranged within the rectangular light-emitting region.

20. The display panel according to claim 12, wherein the shape of the luminance partitions is either a regular triangle or a regular hexagon, wherein, under a condition the shape of the luminance partitions is a regular triangle, the luminance combination region comprises one said first luminance partition and three said second luminance partitions, under the condition the shape of the luminance partitions is a regular hexagon, the luminance combination region comprises one said first luminance partition and six said second luminance partitions.

* * * * *